(12) United States Patent
Cosley et al.

(10) Patent No.: US 6,345,512 B1
(45) Date of Patent: Feb. 12, 2002

(54) POWER EFFICIENT, COMPACT DC COOLING SYSTEM

(75) Inventors: Michael R. Cosley, Crystal Lake; Don C. Mueller, Aurora; Ramon E. Rodriguez, Chicago, all of IL (US)

(73) Assignee: Marconi Communications, Inc., Cleveland, OH (US)

( * ) Notice: Subject to any disclaimer, the term of this patent is extended or adjusted under 35 U.S.C. 154(b) by 0 days.

(21) Appl. No.: 09/882,655

(22) Filed: Jun. 15, 2001

(51) Int. Cl.[7] ............................................. F25D 23/12
(52) U.S. Cl. ...................... 62/259.2; 62/263; 165/80.4
(58) Field of Search ............................. 62/259.1, 259.2, 62/263, 457.9, 505, 508; 165/80.4; 361/687

(56) References Cited

U.S. PATENT DOCUMENTS

| 5,220,809 A | * | 6/1993 | Voss ........................ 62/259.2 |
| 6,205,796 B1 | | 3/2001 | Chu et al. |
| 6,237,353 B1 | * | 5/2001 | Sishtla et al. ............... 62/259.2 |

FOREIGN PATENT DOCUMENTS

| JP | 3-70975 A | * | 3/1991 | ................ 62/259.2 |
| JP | 5-157372 | * | 6/1993 | ................ 62/259.2 |
| JP | 6-34208 A | * | 2/1994 | ................ 62/259.2 |

* cited by examiner

*Primary Examiner*—Henry Bennett
*Assistant Examiner*—Melvin Jones
(74) *Attorney, Agent, or Firm*—Jones, Day, Reavis & Pogue

(57) ABSTRACT

A simple, reliable, compact, low cost and low power cooling system is disclosed. The cooling system is especially suited for an electronic equipment enclosure which is located out-of-doors. The cooling system runs on community AC power which is converted to DC. If community power is disrupted, the cooling system takes power from back-up batteries. If a compressor of the cooling system drops to a temperature of 0° C., a heating subsystem including a conduit loop that runs around the compressor and into the equipment chamber of the enclosure for transporting a heat transferring fluid, is activated for transferring heat from the equipment chamber to the compressor. A closed conduit loop is used to pump a mixture of ethylene glycol between the vicinity of the compressor and the interior of the equipment chamber. In this way, heat generated by the equipment to be cooled is transferred to the compressor to heat the enclosed refrigerant and the equipment is simultaneously cooled. The power required by the system is very low, because the system is compactly constructed and the arranged for maximum efficiency.

21 Claims, 5 Drawing Sheets

POWER EFFICIENT, COMPACT DC COOLING SYSTEM

BACKGROUND OF THE INVENTION

1. Field of the Invention

The present invention relates to a DC cooling system and more particularly to a simple, reliable, compact and power efficient DC cooling system for use in and with electronic equipment enclosures.

2. Description of the Related Art

Electronic equipment enclosures are frequently located out-of-doors where they are exposed to ambient temperatures. Typically, enclosures have at least one chamber in which heat generating electronic components are situated. At certain levels heat may degrade the operation of the components whereas lowering temperature may improve performance. Often a cooling system is operatively connected to the enclosure to ensure that the temperature in the electronic component chamber is maintained within a safe and effective range. Cooling systems include heat exchangers for above ambient cooling and air conditioners for below ambient cooling, as well as other devices and variations or combinations of the above. The more powerful cooling systems include a compressor, a condenser, an expansion device and an evaporator. Usually, such a system is reliable and provides the necessary cooling, although too much power may be consumed. When working in a direct current ("DC") backup mode, where power is provided by batteries, the amount of power consumed is a very important issue and minimization of power consumption is an imperative.

Further, a situation may arise where the ambient temperature is so low that refrigerant in the compressor is cooled sufficiently to change phase from gas to liquid. When this occurs, the compressor may not start, or the compressor may damage itself so that the cooling system becomes inoperative. High powered heaters may be used to heat the compressor and its contents, to keep the compressor lubricated and to keep refrigerant from becoming liquid, but these heaters are expensive and they require excessive energy to operate.

BRIEF SUMMARY OF THE INVENTION

What is described here is a cooling system for an electronic equipment enclosure and an enclosure having such a system, where the enclosure includes a components chamber where heat is generated, a housing operatively connected to the components chamber for enclosing elements of the cooling system, the cooling system including a compressor, a condenser, an evaporator, a refrigerant and means for expanding the refrigerant, and a conduit formed around the compressor and extending into the components chamber of the enclosure, a fluid for selectively moving in the conduit to transport heat from the components chamber to the compressor and a pump for selectively moving the fluid along the conduit. The cooling system is very compact, operable in a DC mode and efficient.

There are a number of advantages, features and objects achieved with the present invention which are believed not to be available in earlier related devices. For example, one advantage is that the present invention provides a very low cost, reliable and simple apparatus to use heat generated in the equipment enclosure to heat a compressor during cold ambient conditions. The present invention obviates the need for an expensive, high powered compressor heater. Another feature of the present invention is to provide a cooling system which is more efficient because the system is compact and effectively designed and the system uses the heat generated by the same components which are to be cooled in a situation where the ambient temperature adversely affects the compressor of the cooling system. The present invention also offers back-up capabilities should the compressor fail. Another advantage of the present invention is that it provides an equipment enclosure that uses less power than prior enclosures having the same heat removal capacity.

Air conditioning systems with independent fluid flow systems have been used in the past but not in the same way as disclosed here. See for example, U.S. Pat. No. 6,205,796 which discloses a refrigeration system for both a cold plate and a heat exchanger as well as an air flow system to control humidity.

A more complete understanding of the present invention and other objects, advantages and features thereof will be gained from a consideration of the following description of the preferred embodiment read in conjunction with the accompanying drawing provided herein.

DETAILED DESCRIPTION OF THE INVENTION

Figure 1:
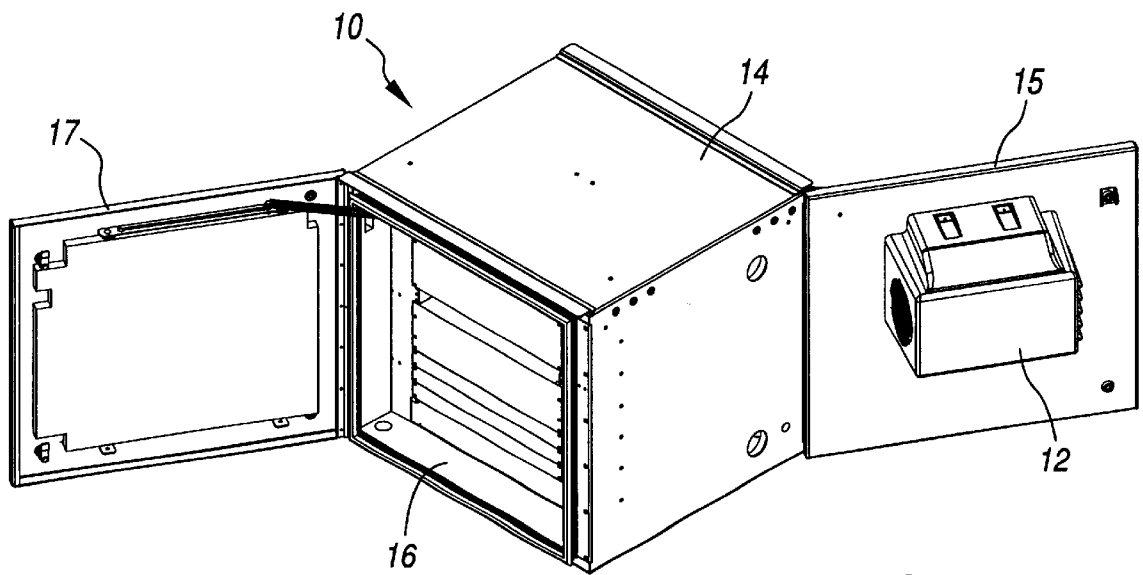
FIG. 1 is an isometric view of an electronic equipment enclosure with a cooling system of the present invention.

While the present invention is open to various modifications and alternative constructions, the preferred embodiment shown in the drawing will be described herein in detail. It is understood, however, that there is no intention to limit the invention to the particular form disclosed. On the contrary, the intention is to cover all modifications, equivalent structures and methods and alternative constructions falling within the spirit and scope of the invention as expressed in the appended claims.

The advantage of compactness may be appreciated by first referring to FIG. 1. There is illustrated an example of an electronic equipment enclosure 10. The enclosure includes a cooling system housing 12 and an equipment housing 14. The equipment housing forms an electronic equipment chamber 16. A battery chamber (not shown) may be formed and attached to the equipment housing 14. In the enclosure shown, the cooling system housing 12 is secured to a rear door 15. The rear door and a front door 17 seal the equipment chamber. The components or equipment may be electronic or optical or both and the cooling system in the cooling system housing 12 is operatively connected to the equipment chamber 16. It is to be understood that the equipment enclosure may be larger or smaller than that shown, and that the enclosure may have the cooling system placed to the side or below or above the equipment chamber. The particular enclosure shown in FIG. 1 is not to be considered limiting in any way as many different enclosure designs may be used with the present invention.

Referring now to FIGS. 2–4 and 6, the various elements of the cooling system are shown. The cooling system is mounted to an "L" shaped bracket 20 having a base 21 and a wall 23 and is enclosed by a removable cover 22. Mounted to the bracket in a very compact fashion is a compressor 24, a condenser 26 and an evaporator 28. A condenser fan 30 is mounted to the condenser 26 and an evaporator fan 32 is mounted to the evaporator. Refrigerant circulates around the system through a first tube 40 which operatively connects the compressor 24 and the condenser 26, a second tube 42 for leading the refrigerant from the condenser to the evaporator through a capillary tube 44 and through the wall 23 located upstream of the evaporator 28 and a third tube 46 connecting the evaporator 28 and the compressor 24 and also passing through the wall 23. A filter/dryer 48 is in-line upstream of the capillary tube 44 as is a sight glass 47. A receiver 49 may also be present to regulate pressure which changes due to ambient temperature changes.

Figure 2:
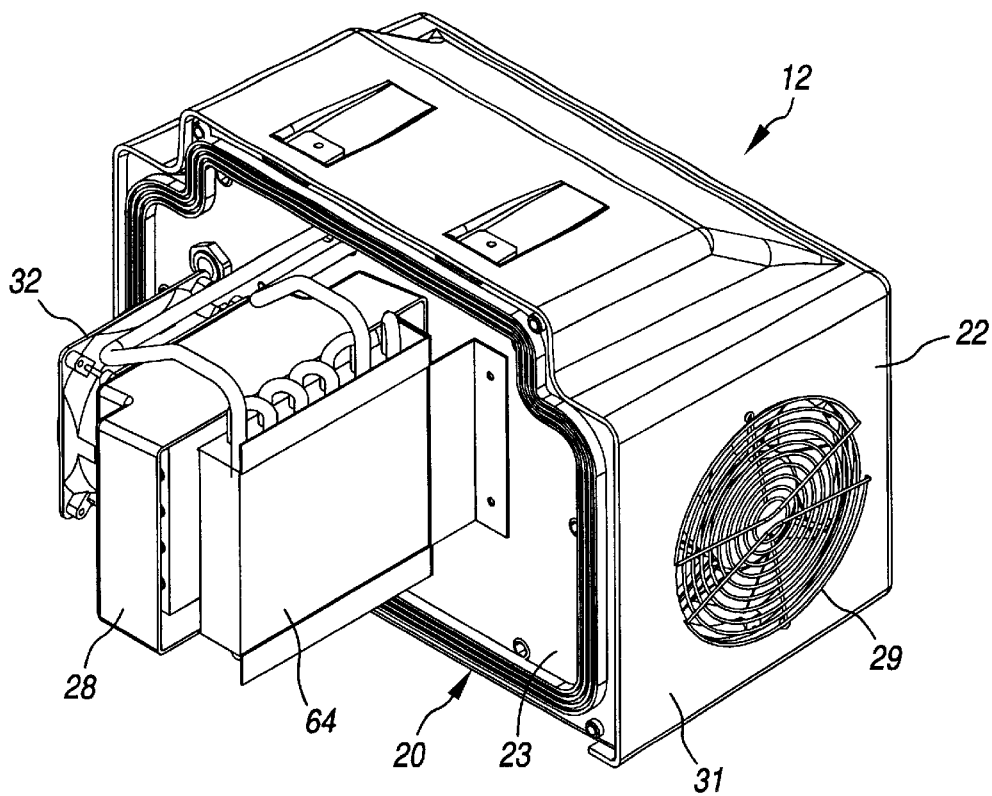
FIG. 2 is a downward looking isometric view from the left rear of the cooling system of the present invention.

The cooling system just described and shown is relatively small and compact, fitting within the cover 22 and having a width of about 14.5 inches, a height of about 10 inches and a depth of about 9 inches. Yet, the system generates about 200 watts of cooling capacity. The small and compact size is a major feature of the present invention. Furthermore, the system requires a relatively low power of 6 amps at about 52° C. The use of plastic for the bracket 20 and the cover 22 also results in several advantages although they may be made from metal. If made of plastic, these items are thermoformed with close fitting tolerances so that when connected as shown in FIG. 2 there is a minimum of air leakage. This results in a very efficient air flow created by the condenser fan 30 across the cooling system moving from vents 25 in a side wall 27 of the cover to exhaust ports 29 in an opposite side wall 31 of the cover. The air flows directly over the compressor and condenser to gain maximum heat pick up before ejection from the housing.

Figure 3:
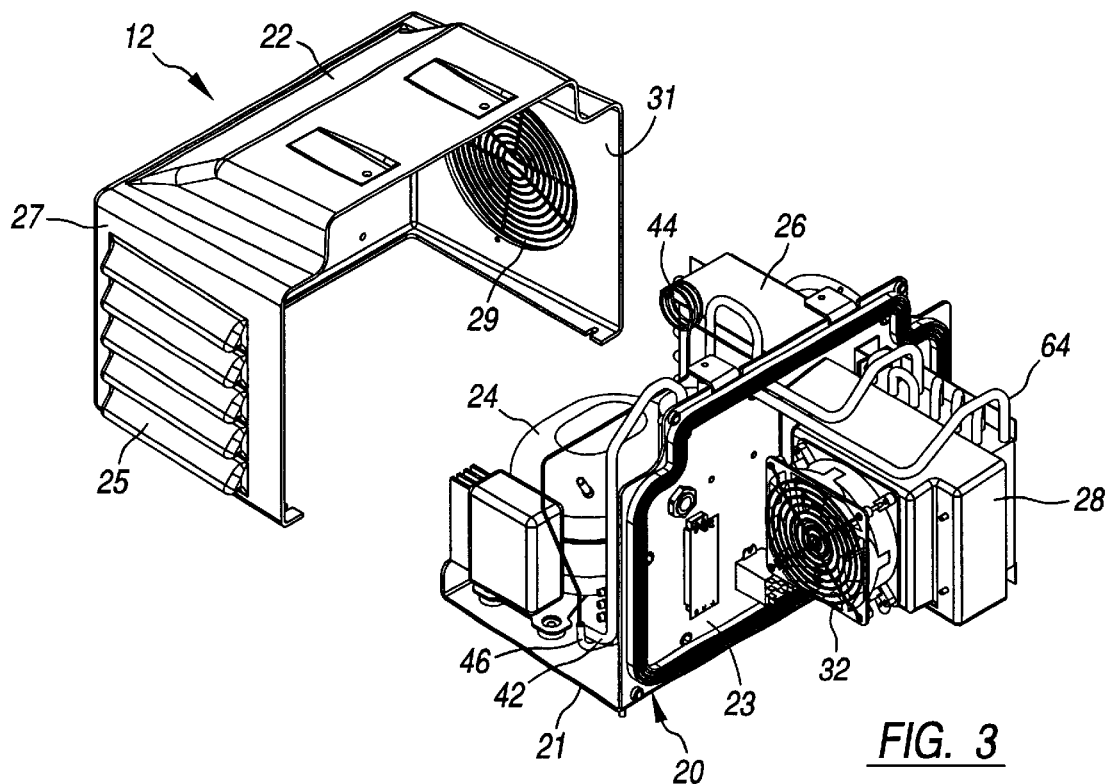
FIG. 3 is a downward looking isometric view from the right rear of the cooling system with its cover removed.
Figure 4:
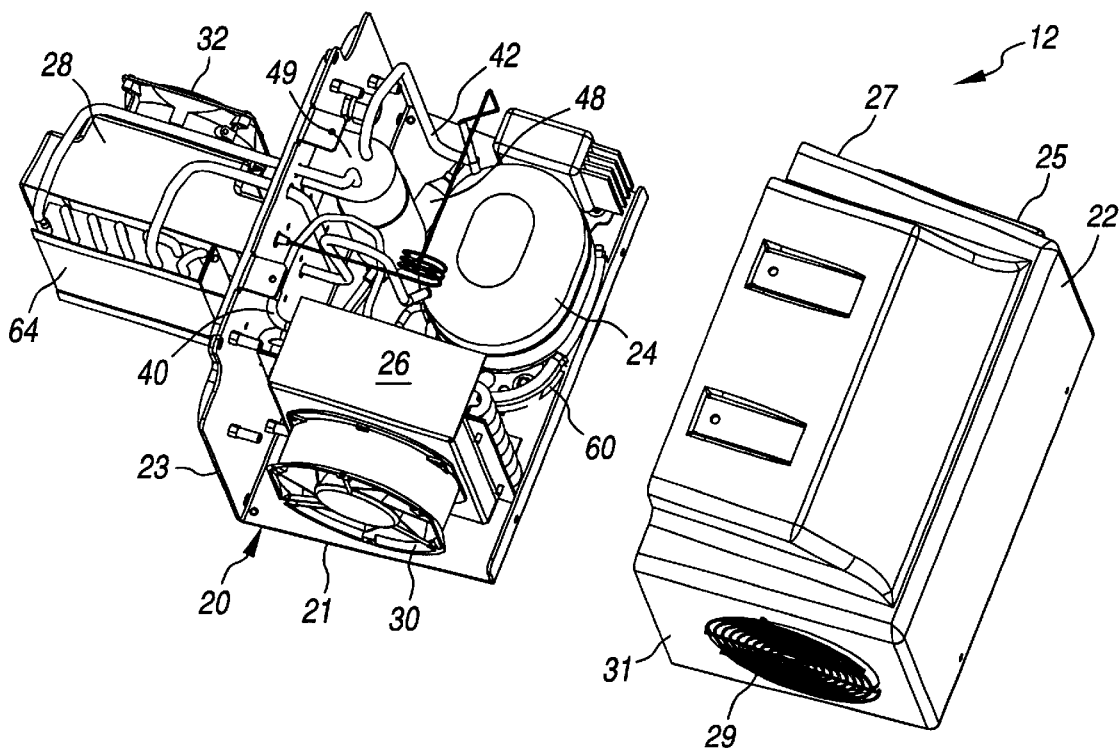
FIG. 4 is a downward looking isometric view of the cooling system shown in FIG. 3, but rotated 180°.

The plastic cover and bracket also enhance aesthetics and structural integrity. The stepped design shown in FIGS. 2 and 3 is very effective. There is a reduction in acoustical noise transmission because of plastic's density and molecular structure, and wind driven rain incursion and insect intrusion are minimized. Vibrations from the condenser fan are also reduced by the bracket and cover combination.

Controls 50 are provided to operate the cooling system. For example, the temperature in the enclosure is monitored and when it reaches 85° F., the compressor is activated. When the temperature drops to 65° F., the cooling system is deactivated. The temperature of the compressor is also monitored and controlled. A problem may develop when the ambient temperature is quite low, sub-zero for example, even though the equipment in the chamber 16 generates heat sufficient to raise the temperature there to 85° F. When the ambient temperature around the compressor is sufficiently low, the refrigerant in the compressor, which is normally in its gas phase, changes to its liquid phase. The compressor, however, may not start when the refrigerant is a liquid, and the compressor may be damaged when attempting a start. A malfunctioning compressor defeats the cooling system and exposes the equipment in the chamber to damage. As mentioned, an electric heater connected to the compressor may be used to warm it, but such an arrangement is expensive and an electric heater uses too much power. When the system is drawing power from back-up batteries due to a community power outage for example, power consumption of the relevant items is critical. Even when operating from community power lines, using too much energy is expensive. Today, thermoelectric coolers ("TEC") may be used as it is also a DC device. However, a TEC is not very efficient. For example, at 48 volts DC at 9 amps efficiency is about 26%. At 24 volts, efficiency drops by half.

Another major advantage of the present invention is the provision of a simple, reliable and low cost apparatus for heating the compressor, when necessary, using the heat generated in the equipment chamber. Referring back to FIGS. 2–4 and 6, and also referring to FIG. 5, there is illustrated a closed circuit conduit 60 of a high thermoconductive tubing, such as copper, formed around the lower portion 61 of the compressor 24. This tubing passes through the wall 23 of the bracket 20 so as to continue into the equipment chamber 16 where the evaporator 28 is also located. (See FIGS. 2 and 8.) That portion of the conduit in the equipment chamber is designated 64 even though it is integral and continuous with the remainder of the conduit outside the equipment chamber, namely, in the housing 12. A simple and inexpensive heat transferring fluid, such as an ethylene glycol mixture, may be used in the tubing to circulate back and forth between the compressor and the equipment chamber. In a warm equipment chamber heat is absorbed by the fluid. When the fluid is then transported around the cold compressor, heat in the fluid is transferred to the compressor by conduction and convection. A small DC pump 66 is used to selectively circulate the fluid. For example, when the temperature of the compressor reaches 0° C., the DC pump is activated and when the compressor has been heated to about 10° C., the pump is turned off. The DC pump is operated by community power as is the compressor, however, when there is an outage, the compressor and the small pump are powered by back-up batteries at twenty four volts DC (but not at the same time). With the simple heating system, not only is the compressor warmed but as a bonus, undesirable heat is removed from the equipment chamber. This provides a failsafe that can also be used upon failure of the compressor.

Figure 5:
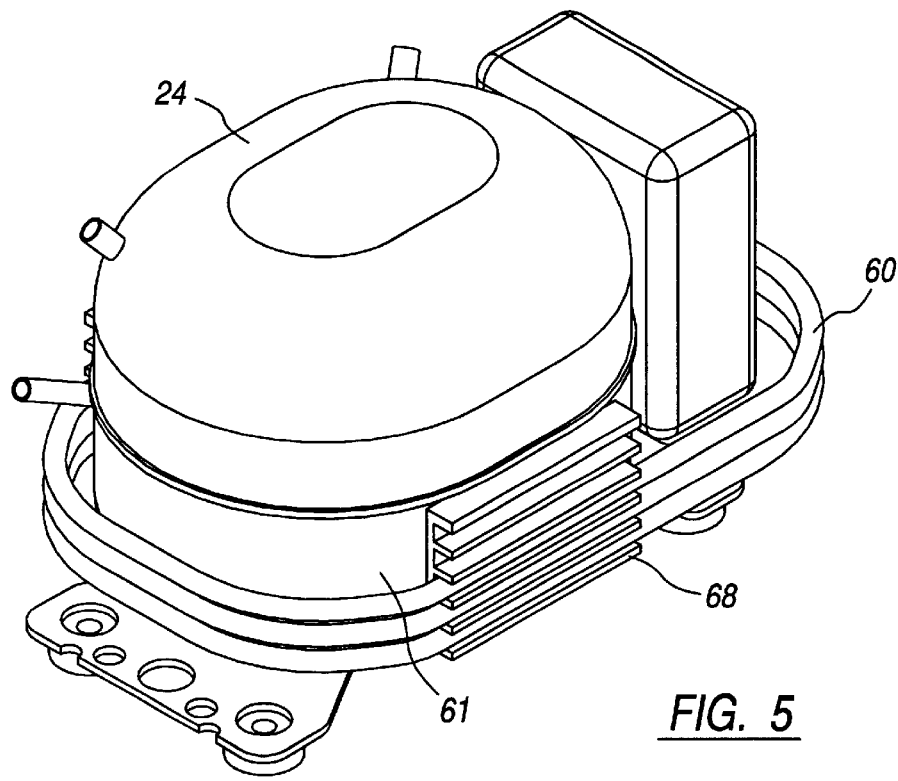
FIG. 5 is an isometric view illustrating conduit coils in direct contact with a compressor of the cooling system shown in FIGS. 3 and 4.
Figure 6:
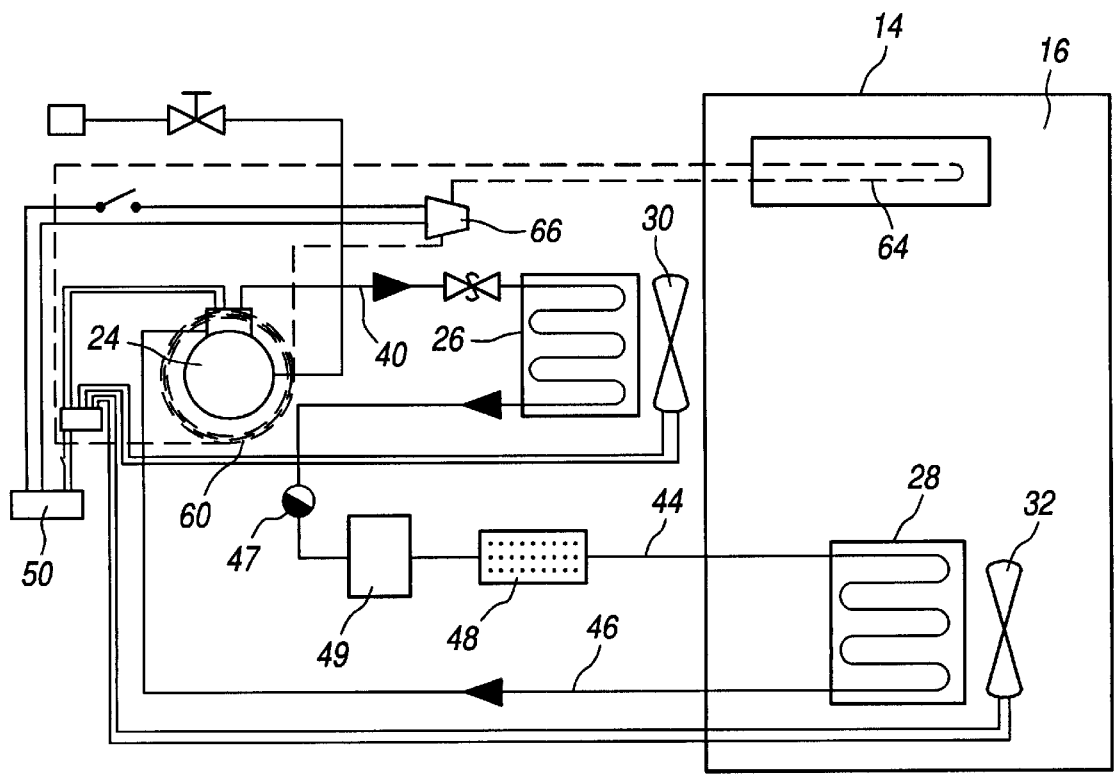
FIG. 6 is a schematic view of the cooling system and enclosure of the present invention.

Referring to FIG. 5, the closed circuit conduit 60 is mounted or press-fitted to fins 68. The fins in turn are attached to the compressor 24. When this is done, heat transfer occurs between the circulating fluid and the compressor through convection and conduction, thereby increasing efficiency. However, variations may be used. For example, the conduit may be tightly wrapped around the compressor, or attached with a thermally conductive adhesive. The DC pump is a low power consumer. Only about 0.5 amps is required for as much as 120 watts of heating. By way of contrast, an electric heater of 100 watts may need as much as 4 amps. Thus, the closed circuit conduit system using a small DC pump is much more energy economical. This supplements well the compact cooling system which operates at 6 amps and has a very high efficiency rating.

Figure 10:
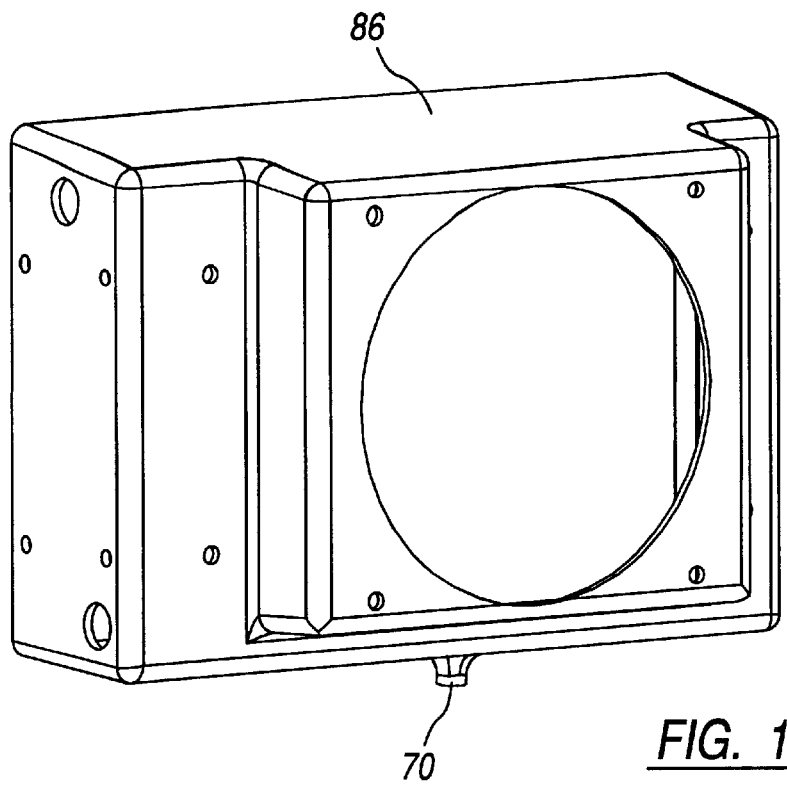
FIG. 10 is an isometric view of an evaporator shroud.

Referring now to FIGS. 2–4 and 8, the evaporator 28 and the evaporator fan 32 are mounted to the wall 23 of the bracket 20 so as to extend generally perpendicular from the wall into the equipment chamber. This disposition enhances the air flow in the chamber so as to make cooling more efficient. Another feature is that use of thermoformed plastic for the wall helps provide for a tight fit to the equipment housing 14 thereby minimizing or eliminating air leaks. Also, as mentioned earlier, plastic reduces structural borne vibrations and may provide for condensation collection by a formed fan and discharge nozzle 70 as shown in FIG. 10.

Referring back to FIG. 6, the cooling system is shown in schematic form. In operation, the compressor 24 sends hot compressed refrigerant through the tube 40 to the condenser 26 where the compressed refrigerant is cooled. The fluid then flows through the tube 42 and through the capillary tube 44 before entering the evaporator 28. The refrigerant loses pressure and cools and then picks up heat from the ambient environment about the evaporator, namely the equipment chamber. The refrigerant is then returned to the compressor by way of the tube 46. This just described cooling cycle is illustrated in solid line. The compressor heating sub-system is drawn in dashed lines showing a closed circuit conduit 60 circling around the compressor and extending to the equipment chamber 16 in the housing 14 of the enclosure 10. The portion of the conduit in the equipment chamber is designated 64. The pump 66 is also shown for selectively moving the heat transferring fluid through the closed circuit conduit.

The controls 50 operate both the compressor portion and the DC pump portion of the total cooling system. The controls monitor the equipment chamber and operate the cooling system between 65° F. and 85° F. If the compressor malfunctions or cools too much, the controls activate the DC pump to warm the compressor and to remove heat from the equipment chamber. The DC pump is turned on at 0° C. (compressor temperature) and turned off at 10° C. (compressor temperature). The DC pump will not operate at the same time as the compressor because the temperature of the compressor is, when operating, much higher than 10° C.

Figure 7:
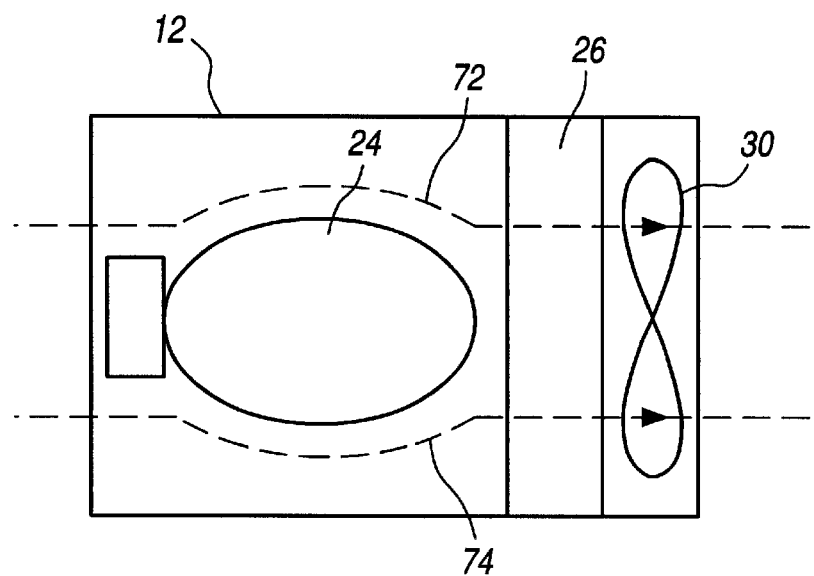
FIG. 7 is a schematic plan view of ambient air flow through the cooling system housing.
Figure 9:
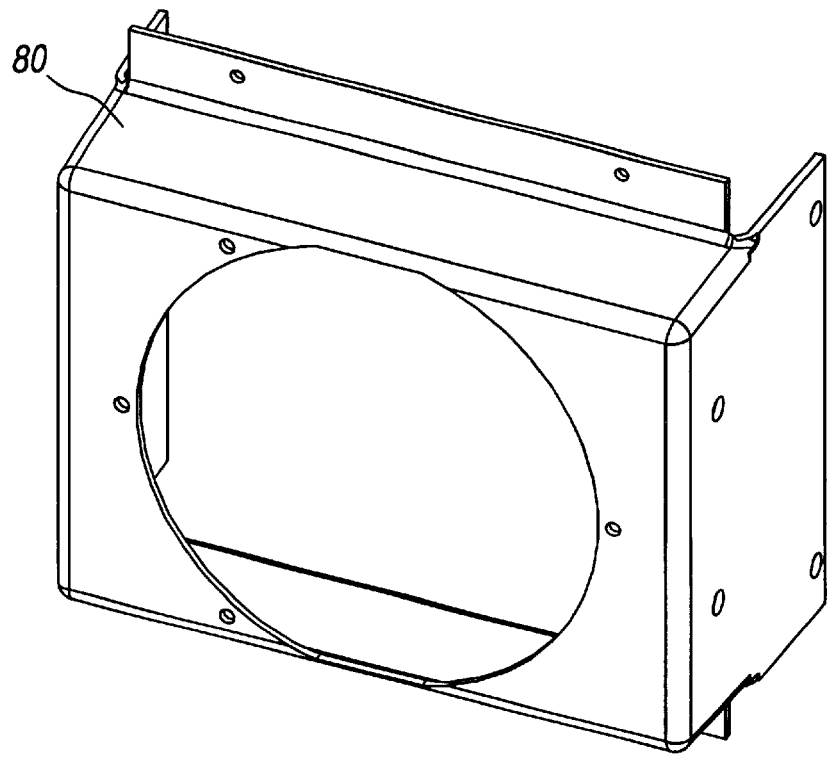
FIG. 9 is an isometric view of a condenser shroud.

Referring now to FIG. 7, the compressor 24, the condenser 26 and the condenser fan 30 are illustrated in the housing 12. Ambient air flow is indicated by the dotted lines 72, 74. The fan works very hard because of the compact arrangement which causes a greater pressure drop. Also the condenser fan works in a higher than ambient environment because it also picks up the heat from the operating compressor. Nevertheless, the axial fan arrangement is an effective trade off to keep power consumption low. Also helping is a condenser shroud 80, FIG. 9, which helps funnel the flowing air for maximum effect.

Figure 8:
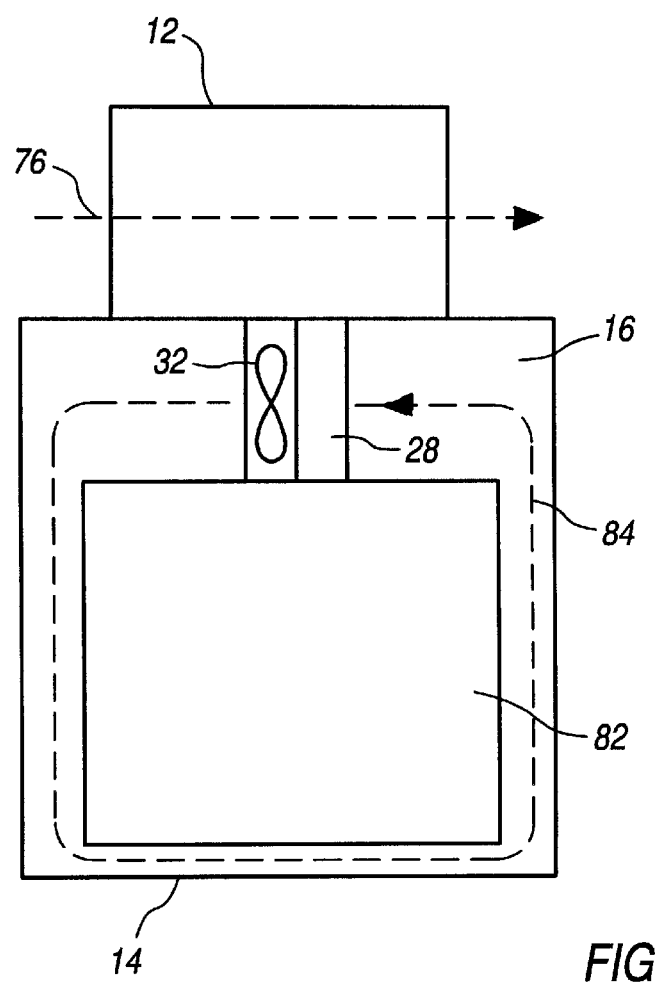
FIG. 8 is a schematic plan view of both ambient air flow through the cooling system housing and air flow within the equipment chamber.

Efficiency is also enhanced by the perpendicular arrangement of the evaporator and the evaporator fan shown in FIG. 8. The evaporator and the fan are located within the chamber 16 of the equipment housing 14. The heat generating equipment is designated 82. The internal air flow 84 generated by the fan 32 is shown in dotted line from side to side. Again effectiveness is key. The ambient air flow 76 through the housing 12 is also shown in dotted line. As shown in FIG. 10, an evaporator shroud 86 is provided to help funnel the chamber air flow to increase efficiency. The lower surface of the shroud and the nozzle 70 facilitate drainage of condensation. The condenser and evaporator shrouds may be made from any suitable material, including metal and plastic.

In operation, the cooling system draws power from community AC lines and the power is converted to DC. If the community power goes out, back up batteries are provided to operate the cooling system including the compressor, the fans and the like. If the compressor malfunctions due to low ambient temperatures or otherwise, the controls will activate the DC pump when the temperature of the compressor reaches a predetermined temperature, preferably about 0° C. When the compressor reaches 10° C., the DC pump will be deactivated. The refrigeration system will be deactivated at an equipment chamber temperature of 85° F. and deactivated when the equipment chamber is cooled to 65° F.

The specification describes in detail an embodiment of the present invention and some variations. Other modifications and variations will under the doctrine of equivalents come within the scope of the appended claims. For example, more coils of conduit may be wound around the compressor. Another fluid, such as Dowtherm or Dynalene, may be used. Further, ethylene glycol may be mixed with water as a means of tailoring its thermophysical properties. These are all considered equivalent structures. Changes in temperature settings for activation and deactivation of the system may be changed without departing from the invention. The dimensions may change with changes in cooling system capacity. Still other alternatives will also be equivalent as will many new technologies. There is no desire or intention here to limit in any way the application of the doctrine of equivalents.

What is claimed is:

1. A cooling system for an electronic equipment enclosure comprising:

a compressor;

a condenser in operative communication with said compressor a refrigerant in operative communication with said compressor and said condenser;

means for expanding said refrigerant;

an evaporator in operative communication with said compressor and said condenser;

a conduit formed around said compressor and extended into a heated portion of said equipment enclosure;

a fluid for selectively moving in said conduit to transport heat from said heated portion of said equipment enclosure to said compressor; and a pump operatively connected to said conduit for selectively moving said fluid in said conduit.

2. A system as claimed in claim 1 wherein:
   said fluid is a mixture including ethylene glycol.

3. A system as claimed in claim 1 wherein:
   said pump and said compressor operate on 24 volts DC.

4. A system as claimed in claim 1 wherein:
   said conduit is a tube having good heat conductive properties.

5. A system as claimed in claim 1 wherein:
   said conduit extends around a lower portion of said compressor.

6. A system as claimed in claim 5 wherein:
   said conduit is a tube having good heat conductive properties.

7. A system as claimed in claim 6 wherein:
   said pump operates on 24 volts DC.

8. A system as claimed in claim 7 wherein:
   said fluid is a mixture including ethylene glycol.

9. A system as claimed in claim 1 including:
   a bracket having a base and a wall, said base for supporting said compressor and said condenser and said wall for supporting said evaporator.

10. A system as claimed in claim 9 including:
    a cover, said cover for tightly mating with said bracket, said cover including opposing side walls having openings therein to allow for the establishment of a flow of ambient air across said compressor.

11. A system as claimed in claim 9 including:

mounting said evaporator with a fan wherein the plane of rotation of said fan is generally perpendicular to said wall.

12. A system as claimed in claim 1 including:

said evaporator being mounted in said equipment enclosure to minimize resistance to air flow across said evaporator.

13. A system as claimed in claim 9 including:

said evaporator being mounted in said equipment enclosure to minimize resistance to air flow across said evaporator.

14. An electronic equipment enclosure having a cooling system comprising:

an enclosure having an equipment chamber where heat is generated;

a housing operatively connected to said equipment chamber for enclosing elements of a cooling system, said cooling system including a compressor, a condenser, an evaporator, a refrigerant and means for expanding said refrigerant;

a conduit extending around said compressor and into said equipment chamber of said enclosure;

a fluid for selectively moving in said conduit to transport heat from said equipment chamber to said compressor; and a pump connected to said conduit for selectively moving said fluid.

15. An apparatus as claimed in claim 14 wherein:

said conduit is a tube having good heat conductive properties.

16. An apparatus as claimed in claim 15 wherein:

said conduit extends around a lower portion of said compressor.

17. An apparatus as claimed in claim 16 wherein:

said fluid is a mixture including ethylene glycol.

18. An apparatus as claimed in claim 17 wherein:

said pump operates on 24 volts DC.

19. An apparatus as claimed in claim 14 including:

a bracket having a base and a wall, said base for supporting said compressor and said condenser and said wall for supporting said evaporator.

20. An apparatus as claimed in claim 19 including:

a cover, said cover for tightly mating with said bracket, said cover including opposing side walls having openings therein to allow for the establishment of a flow of ambient air across said compressor.

21. An apparatus as claimed in claim 14 including:

said evaporator being mounted in said equipment enclosure to minimize resistance to air flow across said evaporator.

* * * * *